United States Patent [19]
Molstad et al.

[11] Patent Number: 4,791,643
[45] Date of Patent: Dec. 13, 1988

[54] SINGLE TRACK ORTHOGONAL ERROR CORRECTION SYSTEM

[75] Inventors: Richard W. Molstad, St. Paul; Robert J. Youngquist, White Bear Lake, both of Minn.

[73] Assignee: Minnesota Mining and Manufacturing Company, St. Paul, Minn.

[21] Appl. No.: 947,409

[22] Filed: Dec. 29, 1986

[51] Int. Cl.⁴ ............................................. G06F 11/10
[52] U.S. Cl. ........................................ 371/40; 371/47
[58] Field of Search ................ 371/37, 40, 38, 41, 371/39, 42, 43

[56] References Cited

U.S. PATENT DOCUMENTS

| | | | |
|---|---|---|---|
| 4,110,735 | 8/1978 | Maxemchuk | 371/43 |
| 4,119,945 | 10/1978 | Lewis | 371/43 |
| 4,128,828 | 12/1978 | Samejima | 371/43 |
| 4,254,500 | 3/1981 | Brookhart | 371/38 |
| 4,292,684 | 9/1981 | Kelly et al. | 371/38 |
| 4,525,838 | 6/1985 | Patel | 371/37 |
| 4,667,327 | 5/1987 | Bright | 371/40 |

*Primary Examiner*—Michael R. Fleming
*Attorney, Agent, or Firm*—Donald M. Sell; William B. Barte

[57] ABSTRACT

An error correcting method for use with a continuous serialized stream of digital information, such as present with digitized stereo audio signals, in which data is formatted in frames containing a preselected number of data words, parity words which in combination with data words of other frames enable correction of data in yet other, spatially remote frames, error check words from which errors in any frame may be detected, and frame sync words, and wherein the parity words are encoded from three orthogonal data sets having in common a single data word so that that word can be reconstructed by operating on any of the three sets, thus enabling correction of that word even if one or two of the three sets also contains an error.

21 Claims, 9 Drawing Sheets $P_0(239) = D_0(0) \oplus D_2(13) \oplus D_4(27) \oplus D_6(42) \oplus D_4(99) \oplus D_2(81) \oplus D_0(64) \oplus D_2(165) \oplus D_4(187) \oplus D_6(210)$ $P_1(239) = D_1(0) \oplus D_3(13) \oplus D_5(27) \oplus D_7(42) \oplus D_5(99) \oplus D_3(81) \oplus D_1(64) \oplus D_0(144) \oplus D_0(118) \oplus D_6(210)$ $P_2(239) = D_8(0) \oplus D_{10}(13) \oplus D_{12}(27) \oplus D_{14}(42) \oplus D_{12}(99) \oplus D_{10}(81) \oplus D_8(64) \oplus D_3(165) \oplus D_5(187) \oplus D_7(210)$ $P_3(239) = D_9(0) \oplus D_{11}(13) \oplus D_{13}(27) \oplus D_{15}(42) \oplus D_{13}(99) \oplus D_{11}(81) \oplus D_9(64) \oplus D_{10}(165) \oplus D_{12}(187) \oplus D_{14}(210)$ $P_4(239) = D_{16}(0) \oplus D_{18}(13) \oplus D_{20}(27) \oplus D_{22}(42) \oplus D_{20}(99) \oplus D_{18}(81) \oplus D_{16}(64) \oplus D_9(144) \oplus D_{11}(165) \oplus D_{13}(187) \oplus D_{15}(210)$ $P_5(239) = D_{17}(0) \oplus D_{19}(13) \oplus D_{21}(27) \oplus D_{23}(42) \oplus D_{21}(99) \oplus D_{19}(81) \oplus D_{17}(64) \oplus D_{16}(144) \oplus D_{18}(165) \oplus D_{20}(187) \oplus D_{22}(210)$ $P_6(239) = D_{24}(0) \oplus D_{26}(13) \oplus D_{28}(27) \oplus D_{30}(42) \oplus D_{28}(99) \oplus D_{26}(81) \oplus D_{24}(64) \oplus D_{17}(144) \oplus D_{19}(165) \oplus D_{21}(187) \oplus D_{23}(210)$ $P_7(239) = D_{25}(0) \oplus D_{27}(13) \oplus D_{29}(27) \oplus D_{31}(42) \oplus D_{29}(99) \oplus D_{27}(81) \oplus D_{25}(64) \oplus D_{24}(144) \oplus D_{26}(165) \oplus D_{28}(187) \oplus D_{30}(210)$ $P_8(239) = D_{32}(0) \oplus D_{34}(13) \oplus D_{36}(27) \oplus D_{38}(42) \oplus D_{36}(99) \oplus D_{34}(81) \oplus D_{32}(64) \oplus D_{25}(144) \oplus D_{27}(165) \oplus D_{29}(187) \oplus D_{31}(210)$ $P_9(239) = D_{33}(0) \oplus D_{35}(13) \oplus D_{37}(27) \oplus D_{39}(42) \oplus D_{37}(99) \oplus D_{35}(81) \oplus D_{33}(64) \oplus D_{32}(144) \oplus D_{34}(165) \oplus D_{36}(187) \oplus D_{38}(210)$ $P_{10}(239) = D_{40}(0) \oplus D_{42}(13) \oplus D_{44}(27) \oplus D_{46}(42) \oplus D_{44}(99) \oplus D_{42}(81) \oplus D_{40}(64) \oplus D_{33}(144) \oplus D_{35}(165) \oplus D_{37}(187) \oplus D_{39}(210)$ $P_{11}(239) = D_{41}(0) \oplus D_{43}(13) \oplus D_{45}(27) \oplus D_{47}(42) \oplus D_{45}(99) \oplus D_{43}(81) \oplus D_{41}(64) \oplus D_{40}(144) \oplus D_{42}(165) \oplus D_{44}(187) \oplus D_{46}(210)$

FIG. 3B

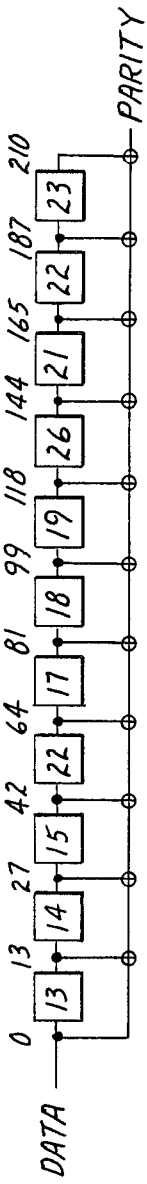

FIG. 3A

SINGLE TRACK ORTHOGONAL ERROR CORRECTION SYSTEM

FIELD OF THE INVENTION

This invention relates to systems and methods for encoding and decoding digital information in a manner enabling detection and correction of errors as may result when the information is transpositioned, in particular to techniques employed with serialized continuous streams of digital information such as with digital audio signals.

DESCRIPTION OF THE PRIOR ART

The prior art contains numerous types of error detection and correction techniques. See, for example, the basic references acknowledged in U.S. Pat. No. 4,525,838 (Patel). Most previously known techniques are directed to the detection and correction of errors in parallel streams of digital data in which one or more streams contain redundant parity information upon which correct data may be reconstructed, provided that the parity information is properly received. The application of error correcting techniques to data to be recorded onto and played back from magnetic recording tape gives rise to a number of additional concerns.

In order to record more data on magnetic tape, it is necessary to employ higher linear recording densities and higher track densities. Typical densities commonly used are in the area of 10 to 20 thousand flux changes per inch and tape track densities of 16 tracks on quarter inch tape. At such densities, the number of data errors occurring are minimal, hence error correcting codes may be used which do not have to achieve a large improvement in error rate. This means that a relatively simple error correcting code can be used and satisfactory results achieved. As the recording density is increased, the recorded bit size on the tape becomes smaller and defects such as tape surface imperfections or signal loss due to dust cause many more data losses. It thus becomes necessary to use an error correcting code which has the ability to correct many more errors.

As noted above, many different error correcting systems are currently being used. A simple system is one in which an even or odd parity bit is added to a byte of data so that if one of the bits in the byte is known to be bad it can be reconstructed from the other good bits and the parity bit. Another system uses Hamming codes and develops multiple parity bits using combinations of the data bits. Simple Hamming codes can be constructed which will detect two errors or correct one error. Similarly, Reed-Solomon codes have the ability to detect and correct larger numbers of errors, but as the number to correct becomes larger and larger it is much more difficult to implement these codes.

In magnetic tape recording, an additional problem arises in that a single error burst can be very long, causing the loss of up to several hundred bits. This situation is usually solved by spatially separating the data and parity associated with a given error correcting algorithm. The long error burst may then be corrected by a number of associated correcting systems. Having two error correcting systems back to back provides additional correcting capability. This is used in the compact disc audio system and is a cross interleaved Reed-Solomon code. The high volumes of such systems being manufactured has made it feasible to design an LSI chip to accomplish the correction, so the cost of implementation is small.

U.S. Pat. Nos. 4,254,500 (Brookhart) and 4,292,684 (Kelly and Youngquist) disclose systems in which serialized data are encoded with interleaved parity data derived from spatially remote information to enable error correction. As in other systems, if the parity information is erroneously received, error correction cannot be performed. In these systems the data is formatted in frames which contain data, parity, CRC and synchronization. The CRC is used to determine if errors have occurred in its data frame. Data in the frame is associated with data and parity in other frames, thus if the CRC indicates bad data in a particular frame, this data can be reconstructed from the data and parity in the associated good frames. When bad frames are encountered, it is also likely that clock synchronization will be lost and the recorded sync word will establish resynchronization. These systems work well as long as the error rate is low, but with high error rates, correction becomes inadequate. These systems also require fifty percent parity overhead plus the addition of the CRC word.

In these systems, it is only possible to correct data using the single associated data parity set. This means that if more than one data and/or parity bit in a set is in error the erroneous data cannot be corrected.

SUMMARY OF THE INVENTION

In contrast to the above systems for operating on continuous serialized streams of digital data, the system and method of the present invention enable correction of erroneous data even though certain parity data associated with the erroneous data is also erroneous. This is effected by placing a given bit of data in more than one parity data set. As long as all the data and parity that is associated with an erroneous bit are different, then the bit can be corrected in as many ways as there are independent data sets. If the independent parity data sets are small, then the overhead becomes large. However, the data sets may be made longer, for example twelve data bits and one parity bit, so that the overhead will not be exorbitant. Any loss of error correction capability that results from the larger data sets is more than offset by the improvement in having multiple error correcting sets. The parity data sets are further required to be common with each other at only one data bit, i.e., that the sets be orthogonal. As in the previous systems last discussed, data, parity, CRC and sync are preferably included in each frame, and the CRC then used to determine whether the frame is good or bad. It is also possible to have subsets of error correction sets in the frames and this can be done to accomplish more uniform error correction hardware algorithms.

More specifically, the system of the present invention for correcting errors in a serialized stream of digital data, comprises means for encoding input digital signals into a succession of frames containing data words, parity words, cyclical redundancy error check code words, and sync words, defining the locations of successive frames. It is preferable that each frame be like all the rest, and thus contain a predetermined number of data words, a predetermined number of parity words, a CRC word and a sync word. Alternatively, certain frames may contain, along with CRC and sync words, only data words, while other frames additionally contain only parity words. The system further comprises means for transpositioning the succession of frames through a data communication system in which errors in said words within said frames may result and means for receiving the transpositioned succession of frames. The latter means responds to the error check code word and provides an error signal upon determining an erroneously received data or parity word within a given frame. Finally, the system includes means responsive to the error signal for operating on other data and parity words for reconstructing an erroneous data word and for substituting a reconstructed data word in place of the erroneous data word. The encoding means particularly comprises means for selecting from the input digital signal at least two sets of data words, each set of which is orthogonal to each other set, having only one common data word, and means for operating on each of the sets to produce corresponding parity words which then processed together with all but one data word of each set can regenerate the remaining data word of that set. Correspondingly, the means for reconstructing an erroneous data word comprises means responsive to the data words and associated parity word of at least one of the orthogonal sets in which the erroneous data word was included.

BRIEF DESCRIPTION OF THE DRAWING

FIGS. 3A and 3B are mathematical description of how parity words are derived from data words according to the present invention;

DESCRIPTION OF THE PREFERRED EMBODIMENT

Figure 1:
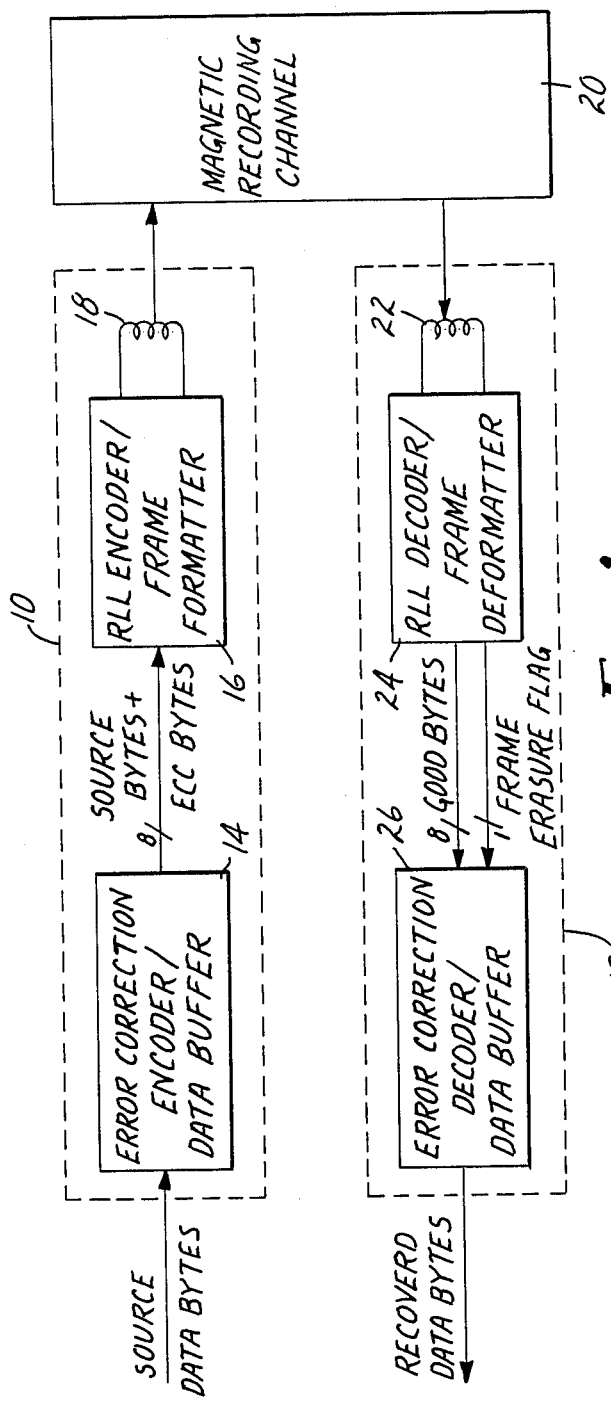
FIG. 1 is an overall block diagram of the error correction system of the present invention.
Figure 2:
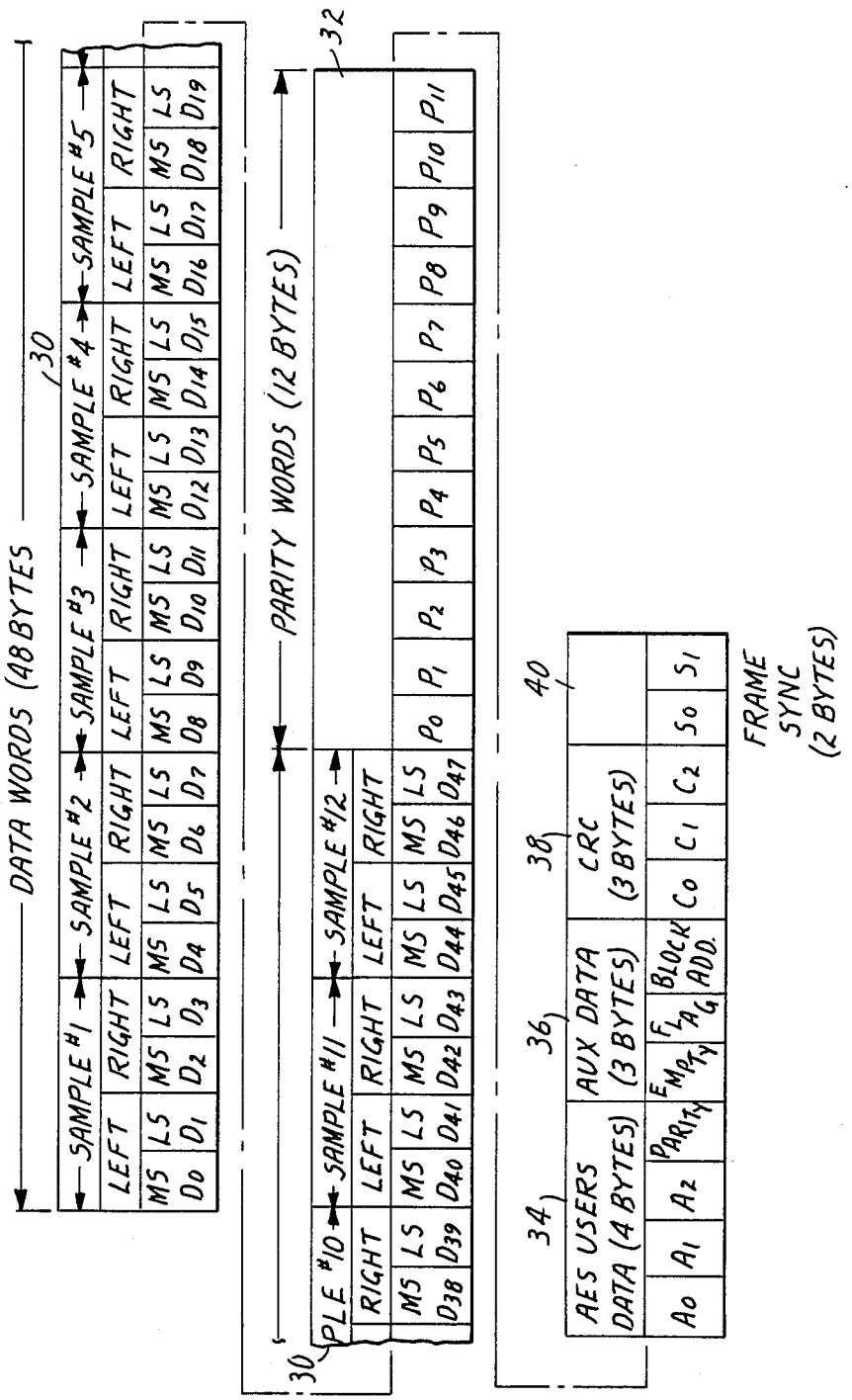
FIG. 2 is a representation of the structure of the frames encoded according to the present invention.

Referring first to FIG. 1, there is shown a block diagram of the single track error correction system according to the present invention. As there set forth, the system comprises a record module 10 and a playback module 12. The record module 10 further comprises an error correction encoder/data buffer network 14, a run length limited (RLL) encoder/frame formatter 16 and a record head 18. The output from the record head 18 is applied to a magnetic recording medium 20 and playback from the medium obtained by means of the playback module 12 which comprises a playback head 22, a RLL decoder/frame deformatter 24 and an error correction decoder/data buffer module 26.

A preferred embodiment of the present invention, is particularly adapted for recording digital audio signals on ¼ inch data cartridges similar to the 3M type DC-2000 or DC-600XTD. In such an application, 16 bit digitized audio signals are obtained from left and right (e.g. stereo) channels, each left and right sample from the channels being in turn formed of eight most significant bits (MSB) and eight least significant (LSB) bits, so that there are a total of thirty-two data bits per sample period. Defining each eight bit series as a data byte, i.e., data word, four bytes thus containing all of the information obtained in one audio sampling period, it is further preferred to group twelve such four byte samples into a frame contain the forty-eight data bytes. When operating at the AES standard sampling rate of 48 kHz, such that each sampling period is 20.83 μsec., it will be seen that the frame rate is 48 kHz divided by twelve, i.e., 4 kHz, and that the frame period is 250 μsec.

In the present invention, a multilevel orthogonal scheme is utilized for generating the parity words upon which error correction may be based. As set forth in more detail hereafter, in such a scheme, twelve parity bytes (parity words) are required to enable correction of the forty-eight data bytes (data words) within each frame. Each frame further desirably comprises four bytes of user data, such as may be utilized for recording time codes and the like, three bytes of frame address information, three bytes of CRC data and two frame synchronization bytes. It may thus be recognized that each frame comprises seventy-two bytes of information. In a preferred embodiment, the information is desirably formatted for recording onto a magnetic tape according to a zero, four, (d,k) eight-ninths rate run length limited group code. Thus each eight bit word is ultimately recorded onto magnetic tape as a nine bit pattern.

In the present invention, a third order level of orthogonality is particularly desired. Thus one may select three independent data sets each containing a given number of data words which are orthogonal in that only one data word is common in all three sets. Every other member of each set is also associated with two other independent data sets. Preferably, each data set contains twelve data words which is operated on to produce a parity word associated with that set. For third order orthogonality, twenty-five percent overhead thus results, and the system performs one error correction for every four data bits. A way of developing an algorithm defining the parity bit for such twelve bit sets is to arrange a three column by four row matrix and to sequentially move data through the three column positions in each row while generating parity at each position. Other data in the three other rows is similarly used in the parity generation and the data words are different in each row. Thus, such a matrix may be identified as having data positions A–L, the positions in each column being separated from an adjacent position a distance a, b, c, d, e, f, g, h and i, and the positions in each row being separated from an adjacent positions a distance o, p, q, r, s, t, u, and v all as shown below:

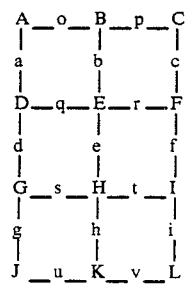

The first data set thus contains data at positions A, B and C in the first row, etc. In a subsequent data set, the data at position A will have moved to the position B and that first at position B will have moved to position C. At the same time in the second row, data at position D will have moved to position E and that at position E to position F, etc. As the data moves from the first column position to a second column, new data enters the first column and data leaves the last column.

Since there can be no common data in the sets, the time to move the data from one row to the next must be unique for each move. This means that there must be variable amounts of delay for the data selected in each of the matrix positions, i.e., the data should be temporarily stored in various storage positions within a solid state RAM memory, so that appropriately delayed data may be selected from each set.

Thus, for example, the delay between position A and position D may be determined according to the expression $a=4w+1$, the delay between positions D and G by the expression $d=4x+2$ and the delay between positions G and J by the expression $g=4y+3$, where w, x, and y are integers. Preferably, $w=x=y=3$, hence the separation between positions A and D is 13, (i.e., $a=4\times3+1=13$) and if data from frame $N=0$ is at position A, data from frame 13 would be at position D.

Similarly, the separation between positions D and G is $d=4x+2=4\times3+2=14$, and again, if data from frame $N=0$ is at position A, data from frame 27 (i.e., $13+14$) would be at position G. Also, the separation between positions G and J is $g=4y+3=4\times3+3=15$, and if data from frame $N=0$ is at position A, data from frame 42 (i.e, $13+14+15$) would be at position J.

Also, there will be varying off-sets between the positions of the respective columns. Each of these differences must be unique, as must all combinations of adjacent sums in each row and column.

All data in each set must also be spatially separated from the other data of the set by an amount at least as great as the largest error anticipated to be encountered. Thus, if a given data to be included in frame $N=0$ is entered in the first row at position A, the data entered at matrix position D would desirably be data to be included in a frame spatially separated from the frame of the previous data a distance $a=4w+1$. The data entered into matrix position G would be that to be included in a frame separated a distance $d=4x+2$, while that in the matrix position J would be data to be included in a frame separated a distance of $g=4y+3$, where x, w, and y are integers. In the next set of data, data entered into matrix position A is preferably that to be associated with frame $N+4$. In this case, data moves into the first row position A, is delayed by $4w+1$, and moves into the first position of row two (Position D). It is then delayed by $4x+2$, and moves into the first position of row three (Position G). Finally, it is delayed by $4y+3$, and moves into the first position of row four (Position J). Since the delay of four times w, x or y has a one, two or three, respectively, added to it, and the data shifts four times between parity generations, it can be seen that each data bit will appear only in one column and will be used only three times in each successive column to generate a given parity word. Also, no two data bits will appear together in more than one set if the row spacings, i.e., if time delays, are appropriately chosen. There are many possible spacings which will satisfy these requirements and a given one may be selected for particularly desired properties.

In a preferred embodiment, the delays or offsets between the respective matrix positions are as follows:

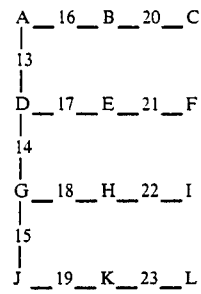

In order to determine an actual data set from such a matrix, it is necessary to remember that the data in a given row must increment by four and therefore each difference must be multiplied by four to find the actual data set numbers. Thus starting with data to be included in frame $N=0$ at matrix position A, the data set would be as follows:

| 0 | 64 | 144 |
|---|----|-----|
| 13 | 81 | 165 |
| 27 | 99 | 187 |
| 42 | 118 | 210 |

Such a set may then be reorganized in ascending order so as to recognize that the data to be included in frames 0, 13, 27, 42, 64, 81, 99, 118, 144, 165, 187, and 210 are utilized to form the parity which is ultimately placed in a particular frame. The positioning of the parity data generated from the data of these frames in subsequent frame 239 is desirable, as it maintains orthogonality and keeps good spatial separation in the correction sets.

Thus with reference to FIG. 3A, it may be seen how data entering at position 0 may shift through a delay system to generate parity. As there shown, the starting data positions are indicated at the top and the data is shifted to the right, with a parity byte generated every fourth data shift. The numbers in the boxes indicate the data positions, or delays, between the data used for parity generation of a given set.

As discussed above, when recording data such as digital audio signals, it is desirable to put data into frames and to construct the frames in such a manner that all of the frames are associated with each other in an identical manner. This then allows the error correction system to handle the error correcting tasks for all frames in the same manner. If data is to be recorded for computer applications, it will most likely be put into data blocks or frames, and the error correcting algorithm developed on a frame by frame basis. For an audio or continuous signal embodiment, in which there are to be three parity words for every twelve data words, it is convenient to make the frame a length sufficient to include a multiple of twelve data words. Also, since frame error detection is best accomplished with a CRC check word, the longer the frame the lower the overhead the CRC adds. From the previous discussion it may be recognized that the frame length is desirably of the same magnitude as burst errors to be anticipated. Thus if a recording density is selected of 50,000 flux transitions per inch, then an error size is in the order of a few hundred bits. A good frame size would then be 48 data bytes. This then requires twelve parity bytes per frame. The CRC size must next be determined and must be selected to be consistent in detecting errors to the same degree as the error correcting system is capable of correcting them. The final error rate is a function of the uncorrected errors expected to be encountered in the ultimately designed recording system. It can be shown that for this system, if the raw error rate is P, the corrected error rate Pc is given by the expression $Pc = a^n \times p^{n+1}$, where a is the set size minus one, and n is the number of data parity sets. If a worst case raw error rate (P) of one in two thousand frames is anticipated, a corrected frame error rate (Pc) of one times ten to the minus tenth would thus be anticipated. Since there are forty-eight data bytes and twelve parity bytes, plus CRC in a selected frame, the ultimate frame length will be slightly over five hundred bits long. Therefore, the number of good bits between uncorrected errors is about five hundred times the reciprocal of the corrected error rate, i.e., there are about 4.6 times ten to the twelfth good bits between errors.

If the digital audio sampling rate is forty-eight kilohertz with sixteen bits per sample in each channel, then in a stereo system the bit rate is 1.536 megabits per second. Since we have forty-eight data bytes or 384 data bits per frame, the frame rate is 1.536 times ten to the sixth divided by 384 or four thousand frames per second. Thus, the time between uncorrected errors is the reciprocal of the corrected error rate divided by the number of frames per second. This calculation gives about 2.3 times ten to the sixth seconds, or 640 hours between errors. In determining the number of CRC parity bits, one may further assume that the probability of determining errors is two raised to the power of the number of the CRC parity bits. The problem with the CRC is not one of detecting errors but of erroneously determining that a frame is good when it really is bad. The chance of such an occurrence is again two raised to the power of the length of the CRC word. Desirably, the capability of the CRC detection is equivalent to the correcting power of the error correction system, and since, for the above example such a capability is one in every 640 hours, an error should not be undetected during that time. Since the raw error rate is one in two thousand, or two errors per second, then two to the X must be about 640 times 3600 times two or 4.6 times 10 to the sixth power, where X is the CRC length in bits. Thus if a CRC length of 24 bits is selected, the capability of not missing errors is one in two to the 24th power or about one in sixteen million. This is slightly more than required, but is desirable since it is three bytes long and neatly fits into the overall frame structure.

A preferred error correction strategy may now be readily described. Since it is only necessary to perform a correction at one fourth the data rate, and there are to be forty-eight bytes of data in each frame, correction is necessary twelve times per frame. Also, since the audio signals are digitized in sixteen bit words for each left and right channel, a constant set algorithm should be selected for every two data bytes. A table showing the relationship between data and parity to accomplish such a uniform correcting algorithm is set forth in FIG. 3B. In that Figure, each data and parity subscript indicates the relative position within the frame while the number in parentheses indicates the frame number of the particular data or parity word. As is there shown, from such an absolutely constant algorithm all other data and parity relationships may be determined by adding the appropriate numbers to the frame numbers set forth in that table. Also it can be seen that all corrections may be made by performing the correcting algorithm on every fourth data word in each frame. Thus, for example, a particular data byte D0[0] can be corrected as follows. In general, the data will be good and not require correction, as when the reproduced D0[0] equals D0[0]. If an error is detected, it can be corrected by combining the parity and data words in accordance with any of the following exclusive OR relationships:

$D0[0] = P0[239] \oplus D2[13] \oplus D4[27] \oplus D0[64] \oplus D2[81] \oplus D4[99] \oplus D6[118] \oplus D0[144] \oplus D2[165] \oplus D4[187] \oplus D6[210]$ $D0[0] = D0[-64] \oplus D2[-51] \oplus D4[-37] \oplus D6[-22] \oplus P0[175] \oplus D2[17] \oplus D4[35] \oplus D6[54] \oplus D0[80] \oplus D2[101] \oplus D4[123] \oplus D6[146]$ $D0[0] = D0[-144] \oplus D2[-131] \oplus D4[-117] \oplus D6[-102] \oplus P0[-80] \oplus D2[17] \oplus D4[35] \oplus D6[54] \oplus D0[80] \oplus D2[101] \oplus D4[123] \oplus D6[146]$ Error correcting sets for other bytes may similarly be derived by using the data and parity relationships set forth above and offsetting frames by the appropriate numbers.

As noted above, it is particularly desirable to format the eight bit data and parity words into a nine bit format for actual recording. If one attempts to record NRZ data, an undesirable low frequency problem may be encountered if there are large numbers of sequential zeros in the data. Furthermore, as recording systems are unable to record DC signals a bandwidth limited system must be utilized. Also, it is necessary to reconstruct clock signals during playback so that tape speed perturbations during record or playback do not cause signal decoding errors. If a saturation recording system is desired in which only positive or negative tape saturation states are recorded, the time between successive transitions must also be constrained. Recording codes that accomplish the above are commonly called d,k codes where d is the minimum and k the maximum number of cells between transitions. During reproduction, the tape clock is regenerated and data is detected by looking for flux transitions on the tape. The highest data rate required for recording is approximately the frequency whose period is twice the time between successive flux transitions. This means that for the same maximum recorded frequency, the size of the window allowed for transition detection during reproduction is the time between transitions divided by one plus d. The decrease in window size means that for a given error immunity where noise is the error cause it is necessary to increase the system signal-to-noise ratio to achieve the same error rate. On the positive side, it can be shown that the decoding efficiency may be increased by making d larger. In a tape system operating at maximum density, it has been found best to make d equal to zero for maximum performance. The parameter k may then be selected on the basis of the lowest frequency requiring good equalization, and ratios (k+1) to (d+1) is effectively the ratio of the maximum to minimum frequency in the recorded bandwidth. If such a ratio is too high, intermodulation and clock recovery during speed perturbations becomes a problem. For the above reasons, a d,k code is desirably chosen with d equal to zero and k equal to four. The rate of the code was selected to be eight/ninths. This means that there are 256 possible input combinations to be coded into nine bit blocks. Of the 512 nine bit combinations, there are more than 256 combinations that conform to the 0,4 (d,k) constraints, such that some are not used. Combinations that are used are chosen on the basis of the low frequency content in the nine bit block. This selection procedure produces blocks with a maximum DC content of 22% or 2/9. Also, since the numeric signal level of audio signals is usually low, the code may be desirably arranged such that the DC content is low for low amplitude audio words.

Figure 4:
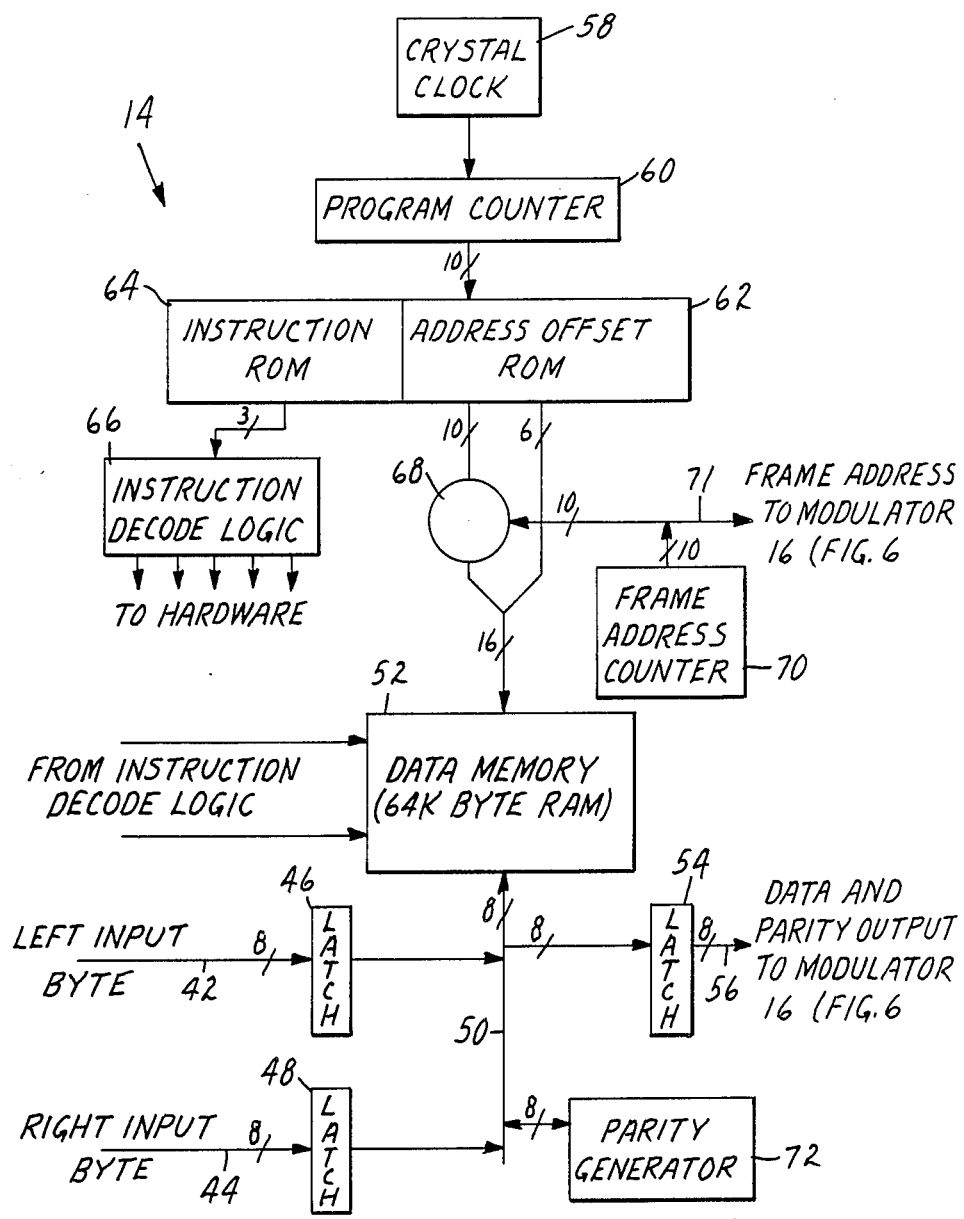
FIG. 4 is a detailed diagram of the error correction encoder included in the system of FIG. 1.

The error correction encoder/data buffer 14 shown in FIG. 1 is set forth in detail in FIG. 4. As may there be seen, digitized audio signals from left and right channels are inputted on eight bit buses 42 and 44, respectively, and the data passes through latches 46 and 48 onto an eight bit main data bus 50. The information then passes into a 64 k byte data memory RAM 52 under appropriate control instructions to be discussed hereafter. Ultimately, encoded data is output through a latch 54 onto data bus 56.

The sequence of operations within the encoder/buffer 14 is primarily controlled by a crystal clock 58, operating at 2.592 MHz. The output of the clock 58 drives a ten bit program counter 60, to in turn control a 1K×16 bit "address off-set" ROM and a 1K×3 bit "instruction" ROM, elements 62 and 64 respectively. The program counter 60 repeats the sequence of instructions (address offsets) every 250 μs frame. The output of the instruction ROM 64 is coupled through a three bit bus to an instruction decode logic 66, the outputs from which are coupled to respective hardware to control the output of various latches, the control inputs to the respective memories and the like. Also, the six bit least significant bit (LSB) output from the address offset ROM 62 is coupled directly to the data memory 52, while the ten most significant bit (MSB) output from the address offset ROM 62 is coupled through a ten bit full adder 68 to the data memory 52. The other input to the adder 68 is provided from a ten bit frame address up counter 70, which is incremented at the basic four kHz frame rate. Also, the output from the ten bit up counter 70 is coupled to the RLL encoder 16 so as to appropriately label each frame with its own, unique address.

Also as shown in FIG. 4, the parity generator 72 responds to data output from the data memory 52 in the manner described above to generate the parity. The output from the parity generator is then fed back on data bus 50 to be temporarily stored within the data memory 52. Thus, in accordance with appropriate instructions, the data words and parity words are output through the latch 54 on data bus 56.

Figure 5:
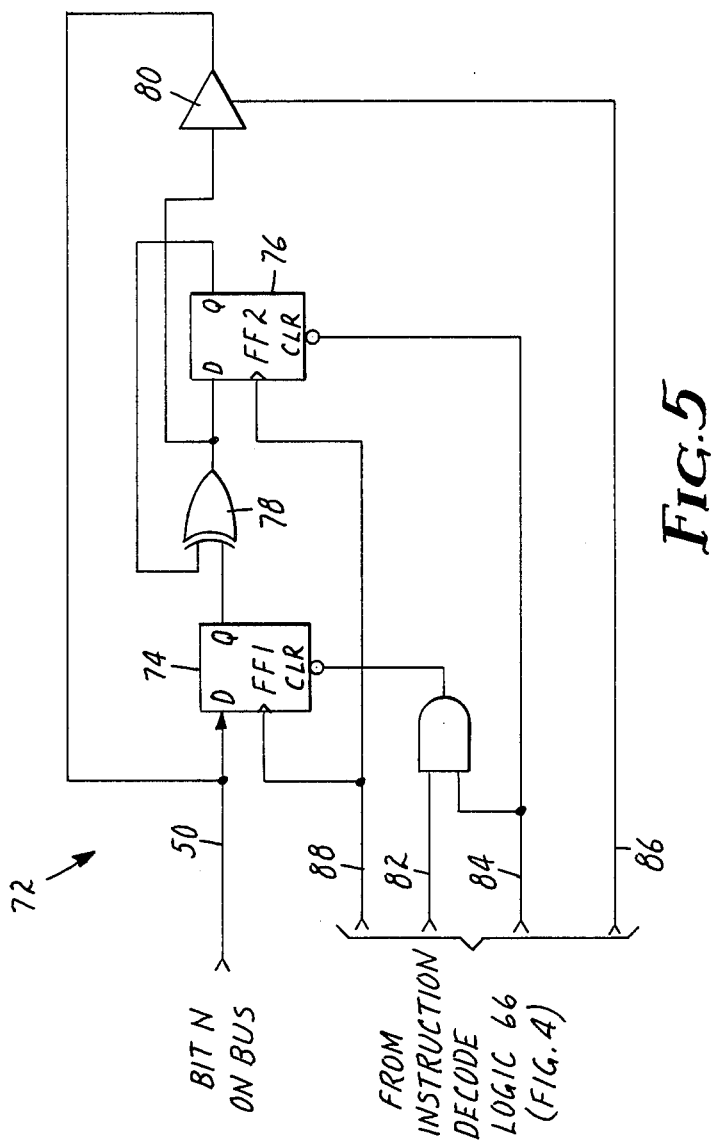
FIG. 5 is a detailed diagram of the parity generator shown in the error correction encoder of FIG. 4.

Details of the parity generator 72 are set forth in FIG. 5. Separate and identical parity generator circuits are provided for each of the eight bits within the data bus 50. Thus a circuit for operating on the first bit may be seen to comprise a pair of flip-flops 74 and 76 respectively, the outputs of which are coupled through an exclusive OR gate 78, and a three state buffer amplifier 80. The first flip-flop 74 functions as an input latch while the second flip-flop 76 functions as a sum storage device so as to provide a cumulative output, which is the modulo-2 sum of all of the preceding bits arriving on the data bus 50 since the last clear instructions were received on leads 82 and 84. When an output enable signal is provided on lead 86, the output from the buffer 80 is coupled back as an input on data bus 50 to the data memory 52. Upon completion of a given correction set, the latches 74 and 76 will be cleared by instructions on leads 82 and 84. Entry of the respective bits on the bus 50 are enabled to be input into the parity generator in response to latch enable instructions on lead 88.

As each successive data word is input on bus 50 to the parity generator 72, a cumulative sum will be generated and ultimately output back onto data bus 50 in accordance with the algorithms set forth in FIG. 3B. Thus, the output corresponding to the first parity byte associated with the algorithm at the top line in FIG. 3B would be first produced. Upon completion of the generation of that parity byte, the output is enabled by means of an instruction on lead 86, and the latches 74 and 76 are cleared pursuant to instructions on leads 82 and 84, thereby enabling the next parity byte to be formed according to the algorithm shown in the second line of FIG. 3B, etc.

Figure 6:
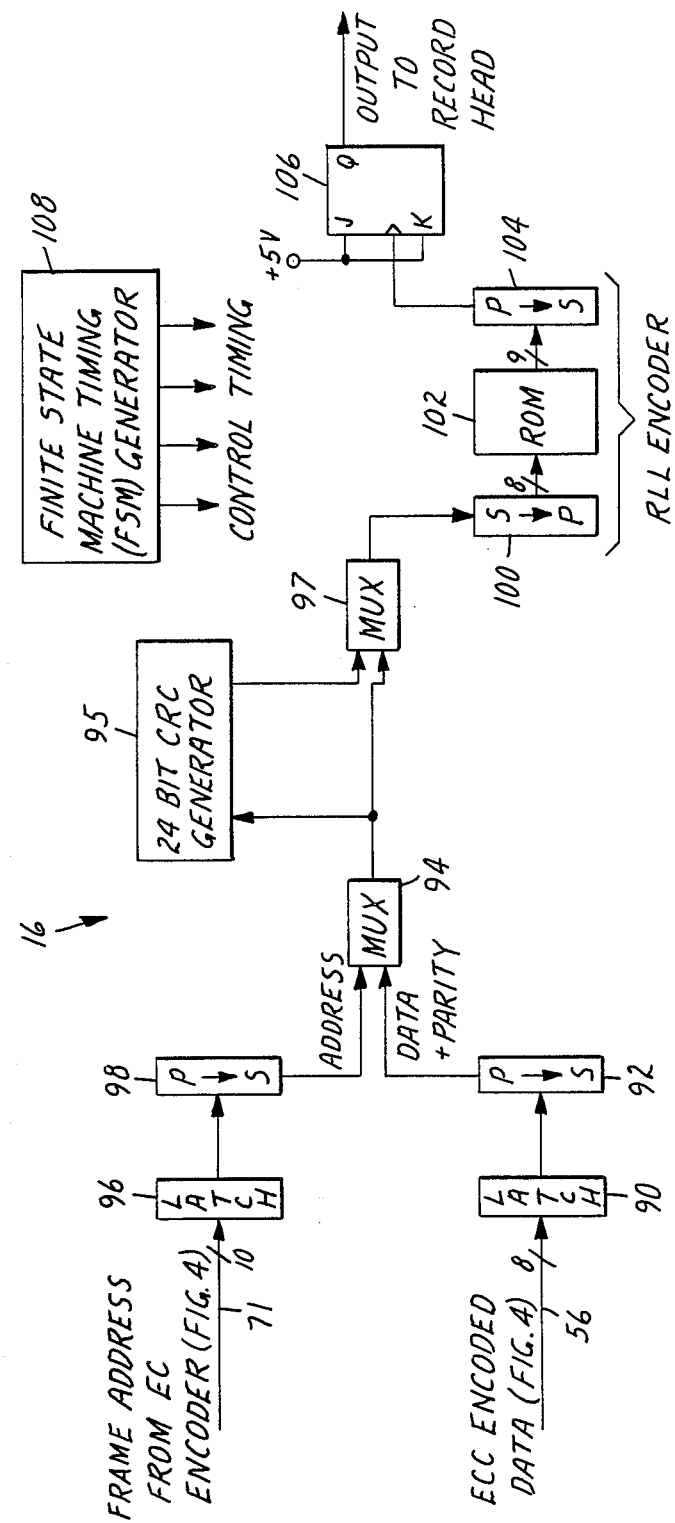
FIG. 6 is a detailed diagram of the RLL encoder/frame formatter of FIG. 1.

The data and parity words outputted from the error correction encoder on lead 56 (FIG. 4) are in turn coupled to the RLL encoder/formatter 16, the details of which are shown in FIG. 6. The function of the encoder/formatter modulator 16 is to serialize the data stream, append a cyclical redundancy check (CRC) code word and a sync word, and to convert the thus serialized data into run length limited codes in suitable form for application to a record head for ultimate recording onto a magnetic tape. Thus as shown in FIG. 6, the data and parity words on bus 56 are coupled through a latch 90 to a parallel to serial shift register 92 and thence to a multiplex circuit 94. Similarly the frame address from the frame address counter 70 (see FIG. 4) is coupled on lead 71 through a latch 96 and parallel to serial shift register 98 to the multiplexer 94. The output of the multiplexer 94 is in turn coupled through a twenty-four bit CRC generator 95, and the respective outputs combined through multiplexer 97. The output of the multiplexer 94 is coupled to a run length limited (RLL) encoder, comprising a serial to parallel converter 100, a ROM 102 and a parallel to serial converter 104. Within the ROM 104, frame sync words are also added to the data stream, so as to enable an output from the parallel to serial converter 104 of fully formatted data frames. The serial output is then coupled to a flip-flop 106 which generates the appropriate current waveform for application to the record head 18 in FIG. 1. The entire encoder/formatter 16 is under control of a ROM based finite state machine timing generator 108, which provides appropriate output timing control signals to all of the various hardware.

Figure 7:
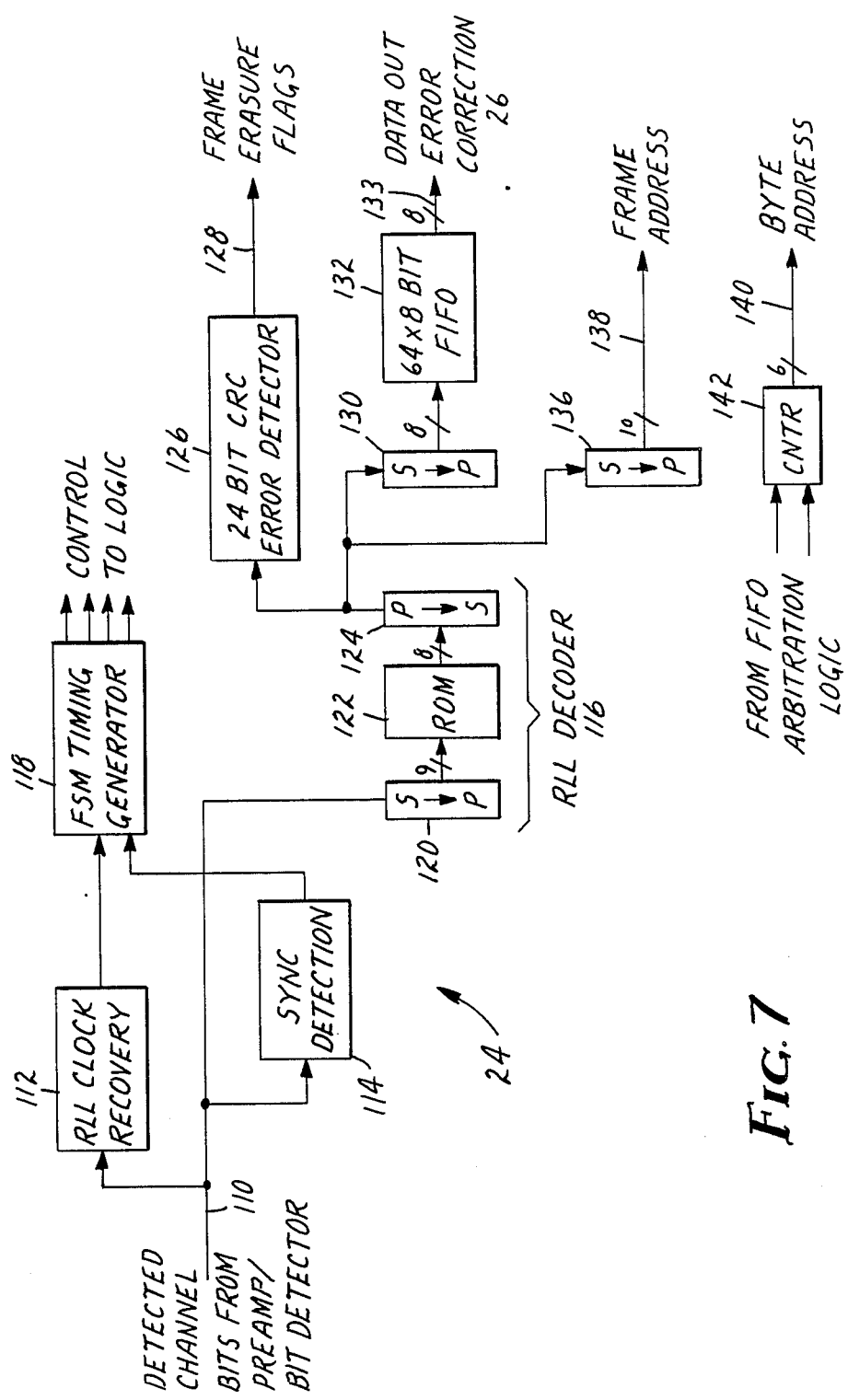
FIG. 7 is a detailed diagram of the RLL decoder/frame deformatter of FIG. 1.

The details of the RLL decoder/frame deformatter 24 within the playback unit 12 are set forth in FIG. 7. As may there be seen, signals reproduced by a playback head 22 are coupled through a preamp/bit detector (not shown) on lead 110, which signals are coupled to a phase lock loop clock recovery circuit 112, a sync detection circuit 114 and RLL detector circuit 116. The recovered clock and recovered sync signals from the circuits 112 and 114 respectively are in turn coupled to a finite state machine timing generator 118 to produce control signals. As shown, the input signals are also coupled to a RLL decoder circuit 116 which comprises a serial to parallel shift register 120, a ROM 122, and a parallel to serial shift register 124. The appropriately decoded signal is then coupled to a twenty-four bit CRC error detector 126. In the event errors are detected in a given frame, a frame erasure flag is output on lead 128.

An output from the RLL detector 116 is also coupled through a serial to parallel shift register 130 to a 64×8 bit FIFO memory 132, where it is held until the data in a given frame is determined to be good, i.e., by the absence of a frame erasure flag on lead 128 as computed by the CRC error detector 126. Also, an output from the RLL decoder 116 is coupled through a serial to parallel shift register 136 to provide a frame address signal on lead 138, and a byte address signal is produced on lead 140 by counter 142, which responds to input instructions from the arbitration logic derived from the contents of the FIFO 132.

Figure 8A:
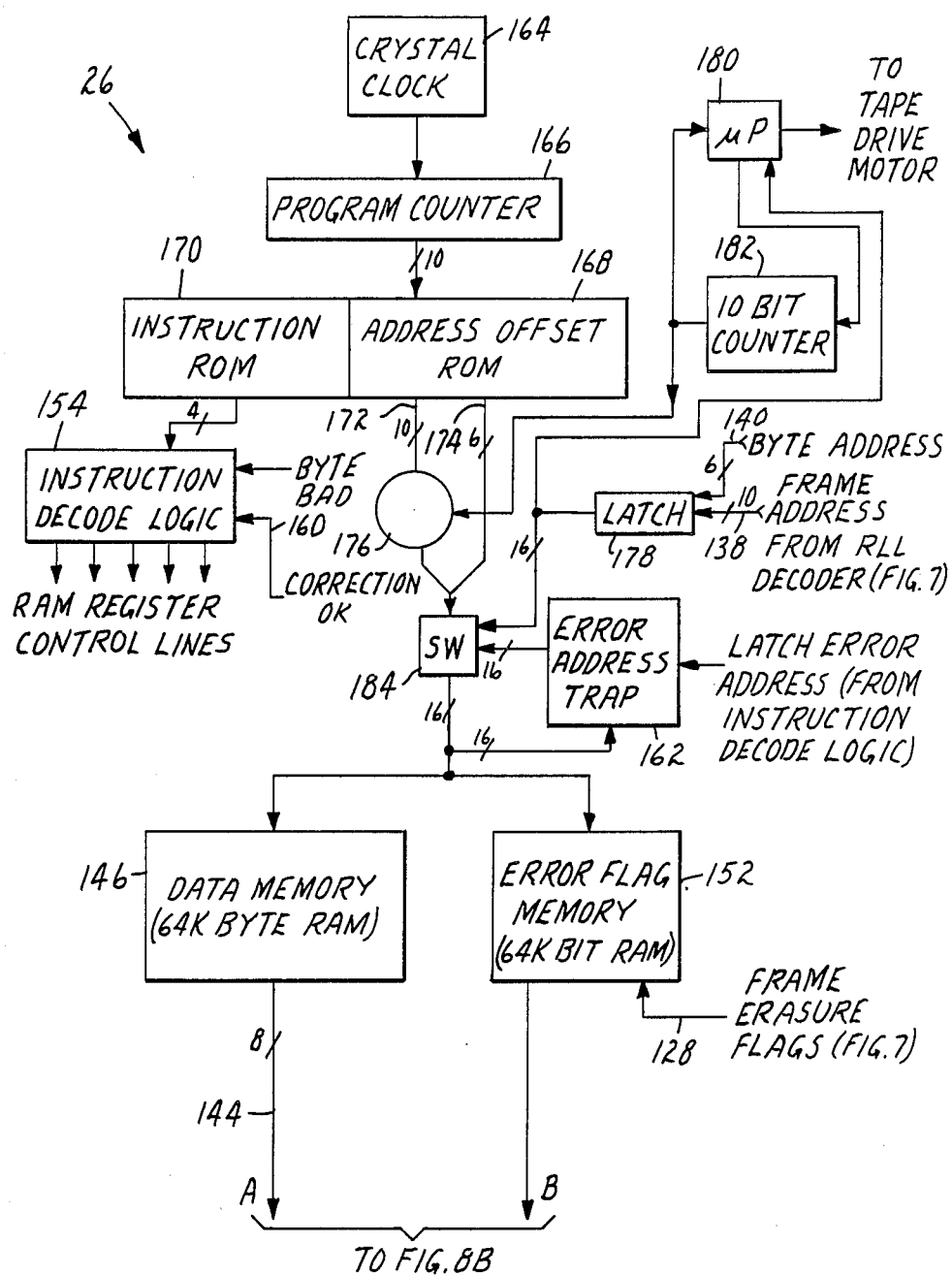
FIGS. 8A and 8B are a detailed diagram of the error correction/decoder shown in FIG. 1.
Figure 8B:
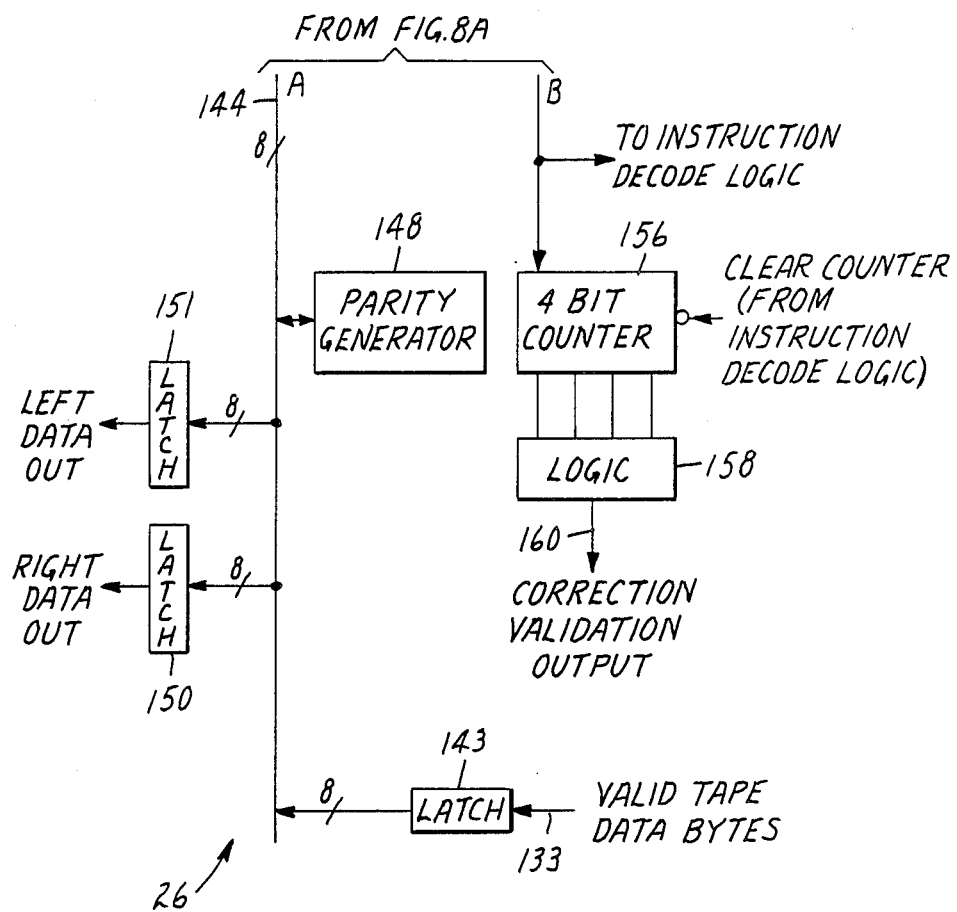

The details of the error correction/decoder 26 shown in FIG. 1 are further set forth in FIGS. 8A and 8B. The output from the FIFO 132 is coupled on lead 133 through a latch 143 to an eight bit data bus 144, whence it is coupled into a 64K byte RAM data memory 146. If data is found to be in error, as indicated by a frame erasure flag on lead 128, the data is processed through the data memory 146 and the parity generator 148. The memory and generator 146 and 148 may be the same hardware as that detailed in FIG. 5. Erroneous data words of a given frame are thereby reconstructed in accordance with the algorithm as discussed above, and the reconstructed words are again stored in the data memory RAM 146. Good data and reconstructed data, as appropriate, are subsequently output into the respective channels via the eight byte buses through latches 150 and 151. As noted, the frame erasure flag signals are input at lead 128 into a 64K×1 bit error flag memory 152, to thereby provide one bit of error status for each data byte. The output of the memory 152 is coupled to both an instruction decode logic 154 and also increments a four bit counter 156 each time a bad flag occurs. The counter 156 is in turn cleared at the start of each correction set. The output from the counter 156 is in turn coupled through a logic circuit 158 to provide an output on bus 160 if the error count is exactly equal to one. The output on bus 160 provides an appropriate input to the instruction decode logic 154 to enable a correction validation output. Outputs from the instruction decode logic 154 are in turn coupled to the parity generator 148 to clear both the registers within that generator at the start of a new correction set, and to clear the input if a bad byte is present.

Whenever a signal in response to a frame erasure flag is output from the error flag memory 152, a signal is also provided to an error address trap 162, the contents of which are subsequently used as the address of a corrected data byte. When a corrected data byte is then regenerated by the interactions between the data memory 146 and parity generator 148, instructions are provided from the instruction decode logic 154 to the error address trap 162 to thereby cause the corrected data from the parity generator to go that address within the data memory 146.

The decoder 26 also includes a sequence controller formed of a crystal clock 164, a program counter 166, an address off-set ROM 168, and instruction ROM 170.

Also, the decoder 26 includes a microprocessor 180 for time base correction. As differences between a base address signal, as provided by a 10-bit counter 182 and the tape address signal outputted from latch 178 are determined within the microprocessor 180, thereby indicating either too fast or too slow playback tape speed, an output is provided to the tape drive motor servo to correct the tape speed as appropriate. The microprocessor further provides a starting address to the 10 bit base address counter 182, thus establishing a desired delay between the input and output of the data.

The output of the counter 182, indicative of time corrected base addresses (and hence of outgoing data) is coupled to a 10 bit full adder 176, where iet is summed together with address offsets from the address offset ROM 168. The switch 184 may then select sixteen bit absolute addresses from the output of the adder 176 together with the bottom six bits of the offset ROM 168, or the tape address latch 178, or the eror address tag 162.

The components of the sequence controller noted above may also be the same as the clock, counter and ROM's 58, 60, 62 and 64 utilized in the error correction encoder shown in FIG. 4. The respective components will then receive a different set of instructions controlling the respective addresses, depending upon whether information is being encoded or decoded. Thus, when in a decode mode, instructions are processed through the instruction ROM 170 to control the respective timing of the instructions from the instruction decode logic 154, while byte addresses and off-set frame addresses are outputted on the leads 172 and 174 through the ten bit full adder 176 to provide the appropriate addresses to the error flag memory 152 and data memory 146. Valid frame addresses are received on lead 138 and are coupled through a latch 178 to further control the the memory address.

In operation, the hardware described above operates in the following manner:

New data from an input digital stream is input at the input latches 46 and 48 approximately every 5 us. During this available time, the bytes are loaded into the data memory 52 at a base frame address determined by the state of the 10 bit frame address counter 70. Byte addressing is obtained directly from the address offset ROM 62. As new data is given a greater frame address, past data has a lessor frame address. Since the base address current input data) can be considered to be at zero offset, past data has a negative offset. In the preferred implementation, the parity for the current frame being formatted is placed 239 frames into 'the past', with the data from frame number −239. After the parity for frame −239 is generated from the data residing in the data memory 52 (frames zero through −239), the data and parity words of the entire frame are output to the formatter 16 from frame −240. In recording then, there is a 240 frame delay from input to output, or 60 ms.

Absolute addresses are generated from the modulo $2^{10}$ binary full adder 68 and the contents of the address offset ROM 62. Since the parity generation algorithm is uniform for each frame, the address offsets and the instructions repeat every frame. The specific operations that need to be done by the ECC encoder 14 are the following (mnemonics in parentthesis): Move data from input latches 42 and 44 to the data memory (WINL,WINR), Move data from memory 52 to output latch 54 (ROUT), Move data from memory 52 to parity generator 72 (RDP), Clear parity generator 72, Move data from memory 52 to parity generator 72 (RPCLR), and Move data from parity generator 72 to data memory 52 (WPAR). Since each parity byte must be produced for every four input bytes, each parity byte must be produced every 20 $\mu$ sec. In those score of microseconds the following actions take place: 4 bytes are written into the data memory 52 (2·WIN,2·WINR), 4 bytes are read out of the data memory 52 (4·ROUT), and one parity byte is generated by reading out the data from the memory at predetermined offset addresses in accordance with the algorithms set forth above (RPCLR, 11·RDP, WPAR). The total number of instructions is 13+8 or 21. The time available for each instruction is then approximately 1 μsec., much more time than is needed for access to a typical DRAM (<200 ns). Because the program counter can easily clock at the actual tape clock rate, 2.592 MHz, much of the time, the record error correction encoder does nothing but execute NOP's. (NOP=a specific instruction that does exactly nothing.)

Data and parity words output from the latch 54 on bus 56 and the frame address output from counter 70 on bus 71 to the formatter 16 are first serialized via the parallel to serial converters 92 and 98, and these serial streams are fed to the serial CRC generator 95 which, after the above data is complete, outputs its internal state (the residue). The CRC check wod is then appended to the above bit stream via multiplexer 97, and the resultant data stream is fed to an eight byte wide serial to parallel shift register 100. Each byte in the stream is transformed by a 512 by 9 bit ROM 102 into a nine bit word which conforms to the RLL d,k constraints of 0,4. The ROM also contains an image of the synchronization word, and it is output at the end of the frame. These 9 bit words are serialized (102) and sent to a toggle F—F 106 whose output waveform is recorded by the write head 18 onto magnetic tape 20.

Upon tape playback, the data waveform is reconstructed by a preamp and detected by a bit detector. Since the channel code is a Run Length Limited code, clock recovery is possible, and is done next (112). With data and clock recovered, detection of the sync signal (114) can be accomplished. The recovered clock and frame sync signals are fed to a Finite State Machine 118 which provides a data byte boundaries, byte addresses, CRC field timing, and other vital frame timing information. The recovered data are sent, under the direction of the FSM 118, to the RLL decode ROM 112. The now decoded data is again serialized 124 for the CRC check process. This well known process computes the CRC check word by examining frame data and compares it to the received CRC check word. If the received CRC check word is the same as the computed check word, no error is assumed. Since the CRC check process must naturally occur at the end of the frame, frame data is temporarily stored in the First In First Out (FIFO) memory 132, which is large enough to hold one frame's worth of data. If the CRC check indicates that the data in the FIFO 132 is 'good', a signal is sent to the ECC decode processor 26 indicating that now is the time to transfer the contents of the FIFO 132 to the large dynamic ECC decode data memory 146. On the other hand, if the CRC indicates that the contents of the FIFO 132 are not correct, no signal is sent, no data transfer takes place, and the FIFO is cleared. The data in the ECC decode processor are therefore all good, although incomplete, until the correction process takes place. The data deformatter 24 also provides the absolute ECC memory address of the frame in question. The frame address is recorded on tape (and made available to the ECC processor by the deformatter) and the byte address is deducible from the state of the FIFO address arbitration logic.

The addressing system of the play ECC processor 26 is very similar to, but is somewhat more complex than the system used in the record ECC processor 14. Fundamentally this is so because the memory 146 serves not only to provide data correction, but also to provide time base correction. Time base correction is necessary when playing back digital audio from an erratically moving tape. When the tape is started from a stopped condition, the base address of all correction activity and output is computed from the first received tape frame address. Enough offset, or data delay, is provided by this calculation to absorb time base variations and the error correction/decode delay. As the tape continues to move, the difference between the input address (current tape frame address) and the current crystal controlled output address is constantly monitored. This difference reflects the current quantity of data in the memory, or conversely, the current total input to output data delay time. If this difference is less than desired, the transport's motor servo is instructed to speed up a little. Conversely, if this difference greater than desired, the motor is instructed to slow down a little, allowing the output to 'catch up'. This feedback mechanism therefore corrects long and short term time base error in the tape signal.

The other significant structural difference between the complimentary ECC processors 14 and 16, respectively, is the addition of an error flag memory system in the play ECC processor. The error flag memory 152 serves to identify what to correct. Each byte in memory has associated with it a one bit indication of its status; its flag. First, the last thing that is done to a data address is that after a byte has been output, the corresponding error flag for that data is made bad. The flag at that address is subsequently made good when a new known good frame is received. This is done in this manner because the address of a bad frame is indeterminable. This procedure essentially says all the data in memory is bad until proven good.

As in the record ECC processor 14, various instructions control operations within the ECC decoder 26 to move data into and out of the data memory 146, from and to various data latches. Frame memory addresses are computed from the $2^{10}$ modulo sum of the ROM based address offset 168 (XXXX hex) and the output base address counter (ZZZZ hex). The state of this counter is initially computed from the first available good tape address, as noted above. The addresses for tape data (memory input data), are recorded with the data and are used as received (YYYY hex). The following is a list of the essential play error correction instructions:

ROUTL XXXX Read data byte at address XXXX+ZZZZ and place in left data register.

ROUTR XXXX Read data byte at address XXXX+ZZZZ and place in right data register.

WTDc YYYY Write data byte from tape data latch to memory address YYYY conditional. (Only execute if frame good and data available, otherwise NOP). Simultaneously, write a good flag at address YYYY.

RPCLR XXXX Read data byte at address XXXX+ZZZZ and place in parity generator after first clearing both registers of the parity generator and resetting the error counter. Simultaneously, read the status of the associated error flag and if this flag is bad, clear the parity generator's input register after the data is loaded. Also, simultaneously, if flag is bad, increment the error counter, and trap address XXXX+ZZZZ in error address trap register.

RDP XXXX Same as RPCLR but both of the parity generator's registers are not cleared initially, not is the error counter cleared. Thus, after this instruction is completed, the output is the EXOR of the input latch and the last sum flip flop 76 (FIG. 5). This output is then the modulo 2 sum of all previous data accessed by RDP or RPCLR since the last RPCLR.

WCD Write to memory corrected data (or parity) at address contained in error address trap if and only if error counter state is equal to one. Simultaneously write 'good' to error flag memory.

WBF XXXX Write a 'bad' flag into flag memory at address XXXX+ZZZZ

With this small instruction set, the play ECC processor 26 can perform its task of error correction. The instructions necessary to correct a single byte are as follows and must be performed in this order: RPCLR, RDP, (RDP 11 MORE TIMES), WCD. The instruction names RPCLR and RDP are somewhat misleading, because as is stated above, each associated data set consists of 12 data bytes and only one parity byte. Whether the byte operated upon is data or parity depends only on the absolute address, since the address offset adder 176 operates only on the top 10 bits of the absolute address, and the bottom 6 bits of the address offset (contained in ROM) determine the intra-frame address, and therefore the identity of the byte. The frame address offsets for a correction are as stated previously. An unusual feature of this implementation is that as each frame is operated on, it is unknown whether an error correction is at all possible. The correction will fail and nothing will happen if the associated data-parity set contains more than one error.

As in the record processor 14, for every four bytes ultimately output, four bytes must be received from the deformatter 26, and one correction set must be operated on. Due to the I/O rates and the inherent speed of operation, there is sufficient time to perform two correction sets per sample time. The second correction set must be done after (after in the sense of address offset time) the first pass is complete. This so called 'second pass' EC cycle improves the correction power of the overall scheme at the cost of further data delay from tape to output. In the event the 'first pass' error correction fails for a particular byte, there is an implication that there was more than one error in each of the three associated sets for that byte. In other words, there were at least a total of four errors in this particular correction triplet; two in each set. Each extra byte in error, those erroneous bytes not common to the failed triplet, has associated with it two other completely independent correction sets. If correction of these errors is possible, it will surely be done by the end of the first pass. Therefore, by executing the whole algorithm again, after the first has been completed, i.e., during a second pass, a reasonable probability exists of performing an error correction which could not be achieved during the first pass.

We claim:

1. A system for correcting errors in a serialized stream of digital data, comprising
   means for encoding an input digital signal into a succession of frames containing data words, parity words, cyclical redundancy error check code words corresponding to other words in each frame, and sync words defining the locations of successive frames;
   means for moving said data having a said succession of frames through a data communication system in which errors in said words within said frames may result,
   means for receiving said data having said succession of frames and responsive to a said error check code word for providing an error signal upon determining the presence of an erroneous data or parity word within a given frame,
   means responsive to a said error signal for operating on other data and parity words for reconstructing a correct data word corresponding to an erroneous data word and for substituting said reconstructed correct data word in place of said erroneous data word,
   wherein said encoding means further comprises
   (a) memory means having successive locations for temporarily storing at least a minimum number of data words sequentially occurring in said input digital signal,
   (b) means responsive to data words stored at locations selected according to a constant set algorithm for defining at least two sets of data words, each set having only one common data word, the sets thereby being orthogonal to each other and
   (c) exclusive-OR logic means responsive to all data words within each of said sets for producing parity words each of which corresponds to one of the sets and which when processed by exclusive-OR logic together with all but one data word of that set can regenerate the remaining data word of that set, and
   wherein said means for a reconstructing a correct data word comprises exclusive-OR logic means responsive to the data words and associated parity words of at least one of said orthogonal sets in which said erroneous data word was included.

2. A system according to claim 1, further comprising means for inserting a reconstructed corrected data word in an output stream of serialized digital data in place of an erroneous data word.

3. A system according to claim 1, wherein said reconstructing means comprises means for operating on all data words and associated parity words of all orthogonal sets containing a said erroneous data word for reconstructing said erroneous word.

4. A system according to claim 1, wherein said selecting means comprises means for selecting three independent sets of data words, each set being orthogonal with each other set, and wherein said reconstructing means comprises means for operating an all data words and parity words within all three sets containing a said erroneous data word for reconstructing said erroneous data word.

5. A system according to claim 1, wherein said encoding means comprises means for encoding said input signal into successive frames each of which contains a predetermined number of data words, and a predetermined number of parity words derived from data words of other frames.

6. A system according to claim 1, wherein said encoding means comprises means for formatting said data and parity words into record blocks containing a plurality of frames in which certain frames of a given block contain only data words and other frames contain only parity words.

7. A system according to claim 1, wherein said encoding means comprises means for formatting said frames to contain one fourth as many parity words as there are data words, thus providing 25% redundant information in the encoded frames.

8. A system according to claim 7, wherein said encoding means comprises means for formatting 48 data words and twelve parity words into each frame.

9. A system according to claim 1, wherein said encoding means comprises means for formatting each frame to contain forth-eight data words and twelve parity words and for deriving said twelve parity words of each frame N from data words in different positions within frames N-239, N-226, N-212, N-197, N-175, N-158, N-140, N-121, N-95, N-74, N-52 and N-29.

10. A system according to claim 1, wherein said means for defining at least two sets of data words comprises (i) means for selecting twelve data words stored at any given time for each said set, each of the selected twelve data words of any given set being spatially separated in the incoming data stream from the closest other data word of that set by a predetermined spatial distance which is greater than the largest error anticipated during data movement and having a relationship with the other data words of the set which is defined by a matrix of four rows and three columns of data words, and (ii) means for moving data words through a succession of positions along one of the three rows of the matrix such that any given data word is successively positioned in the three positions of one of the rows and never appears in any other row, thus assuring that each data word will appear in three data sets, and only in three data sets and will appear no more than once with any other data word in any given set, thus resulting in three said orthogonal data sets.

11. A system according to claim 23, wherein said encoding means comprises means for sequentially shifting stored data words through a delay system to cause each successive data word of a given set to be separated from the preceding data word by a number sequentially taken from the following progression 13, 14, 15, 22, 17, 18, 19, 26, 21, 22 and 23.

12. A system according to claim 10, wherein said means for selecting twelve data words for each set includes means responsive to a said constant set algorithm for (i) selecting the data words consistent with the following matrix:

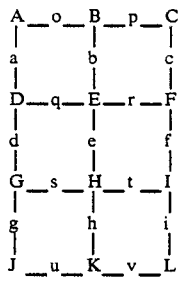

where A through L are respective positions in the matrix at which said selected data words may be positioned at any given time, a through i are the spatial offsets between said words selected to be in each row in each of the respective columns and o through v are the spatial offsets between the words selected to be in each column in each of the respective rows, (ii) selecting data words at positions A, D, G and J of said matrix at any given time such that the spatial offsets of the data words at those positions is given by the expression $a=4w+1$, $d=4x+2$ and $g=4y+3$, respectively, where w, x and y are integers, and (iii) selecting data words at the successive positions in each successive column along each row of said matrix at any given time such that the spatial offsets o through v of the data words at each said successive position from the word in the same row and preceding column position are four times a given integer, each integer being different from all other integers and from one-fourth the spatial separation between data words positioned in the first and third columns of each row, and wherein said encoding means includes means for sequentially shifting and outputting said stored data words in a said succession of frames in which the data words are in the same spatial sequence as in the input digital signal, said parity words being formatted in frames spatially remote from the frames containing data words from which the parity words were formed.

13. A system according to claim 12, wherein means for selecting the data words at the respective positions comprises means for selecting data words such that the integers defining the spatial separations o and p between the positions of the first row are 16 and 20, respectively, the integers defining the spatial separations q and r between the positions of the second row are 17 and 21, respectively, the integers defining the spatial separations s and t between the positions of the third row are 18 and 22, respectively, and the integers defining the spatial separations u and v between the positions of the fourth row are 19 and 23 respectively.

14. A system according to claim 13, wherein said encoding means comprises means for selecting the integers w, x and y to all equal three.

15. A system according to claim 14, wherein said encoding means comprises means for selecting the data words in each position of the matrix at any given time from the following spatial positions:

| 0 | 64 | 144 |
|---|---|---|
| 13 | 81 | 165 |
| 27 | 99 | 187 |
| 42 | 118 | 210. |

16. A system according to claim 12, comprising selecting twelve data words for each set by responding to a said constant set algorithm by (i) selecting the data words consistent with the following matrix:

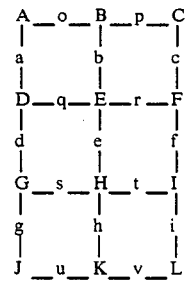

where A through L are respective positions in the matrix at which said selected data words may be positioned at any given time, a through i are the spatial offsets between said words selected to be in each row in each of the respective columns and o through v are the spatial offsets between the words selected to be in each column in each of the respective rows, (ii) selecting data words at positions A, D, G and J of said matrix at any given time such that the spatial offsets of the data words at those positions is given by the expression $a=4w+1$, $d=4x+2$ and $g=4y+3$, respectively, where w, x and y are integers, and (iii) selecting data words at the successive positions in each successive column along each row of said matrix at any given time such that the spatial offsets o through v of the data words at each said successive position from the word in the same row and preceding column position are four times a given integer, each integer being different from all other integers and from one-fourth the spatial separation between data words positioned in the first and third columns of each row, and by sequentially shifting and outputting said stored data words in a said succession of frames in which the data words are in the same spatial sequence as in the input digital signal, said parity words being formatted in frames spatially remote from the frames containing data words from which the parity words were formed.

17. A method for correcting errors in a serialized stream of digital data, comprising encoding an input digital signal into a succession of frames containing data words, parity words, cyclical redundancy error check code words corresponding to other words in each frame and sync words defining the locations of successive frames, transpositioning said succession of frames through a data communication system in which errors in said words within said frames may result, receiving said transpositioned succession of frames and responding to a said error check code word for providing an error signal upon determining the presence of an erroneous data or parity word within a given frame, responding to a said error signal, operating on other data and parity words to reconstruct a correct data word corresponding to an erroneous data word and substituting said reconstructed correct data word in place of said erroneous data word, wherein said step of encoding further comprises (a) temporarily storing at successive locations within a memory at least a minimum number of data words sequentially occurring in said input digital signal, (b) responding to data words stored at locations selected according to a constant set algorithm and deriving at least two sets of data words, each set having only one common data word, the sets thereby being orthogonal to each other and (c) responding by exclusive-OR logic to all data words within each of said sets and producing parity words each of which corresponds to one of the sets and which when processed by exclusive-OR logic together with all but one data word of that set can regenerate the remaining data word of that set, and reconstructing a said correct data word via exclusive-OR logic in response to the data words and associated parity words of at least one of said orthogonal sets in which said erroneous data word was included.

18. A method according to claim 17, further comprising inserting a reconstructed corrected data word in an output stream of serialized digital data in place of an erroneous data word.

19. A method according to claim 17, comprising operating on all data words and associated parity words of all orthogonal sets containing a said erroneous data word for reconstructing said erroneous word.

20. A method according to claim 17, comprising selecting three independent sets of data words, each set being orthogonal with each set, and operating on all data words and parity words within all three sets containing a said erroneous data word for reconstructing said erroneous data word.

21. A method according to claim 17, comprising (a) selecting twelve data words stored in any given time for each said set, each of the selected twelve data words of any given set being spatially separated in the incoming data stream from the closest other data word of that set by a predetermined spatial distance which is greater than the largest error anticipated during data movement and having a relationship with the other data words of the set which is defined by a matrix of four rows and three columns of data words, and (b) moving data words through a succession of positions along one of the three rows of the matrix such that any given data word is successively positioned in the three positions of one of the rows and never appears in any other row, thus assuring that each data word will appear in three data sets, and only in three data sets and will appear no more than once with any other data word in any given set, thus resulting in three said orthogonal data sets.

* * * * *

UNITED STATES PATENT AND TRADEMARK OFFICE
CERTIFICATE OF CORRECTION

PATENT NO. : 4,791,643

DATED : December 13, 1988

INVENTOR(S) : Richard W. Molstad and Robert J. Youngquist

It is certified that error appears in the above-identified patent and that said Letters Patent is hereby corrected as shown below:

Col. 3, line 17, "then" should read --when--.

Col. 8, line 9, after "D4[27]" insert --D6[42]--.

Col. 8, lines 18-19, delete both lines and insert --D0[-80] ⊕ D2[-63] ⊕ D4[-45] ⊕ D6[-26] ⊕ P0[95] ⊕ D2[21] ⊕ D4[43] ⊕ D6[66]--.

Col. 12, line 37, "current" should read --(current--.

Col. 13, line 16, "wod" should read --word--.

Col. 14, line 65, "not" should read --nor--.

Col. 17, line 1, "forth-eight" should read --forty-eight--.

Col. 17, line 29, "23" should read --10--.

Col. 20, line 35, "in" should read --at--.

Signed and Sealed this

Twenty-third Day of January, 1990

Attest:

JEFFREY M. SAMUELS

Attesting Officer     Acting Commissioner of Patents and Trademarks